United States Patent
Nakamura et al.

(10) Patent No.: US 8,669,632 B2
(45) Date of Patent: Mar. 11, 2014

(54) SOLID-STATE IMAGING DEVICE AND METHOD FOR MANUFACTURING THE SAME

(75) Inventors: Tetsuya Nakamura, Osaka (JP); Motonari Katsuno, Kyoto (JP); Masayuki Takase, Osaka (JP); Masao Kataoka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/448,658

(22) Filed: Apr. 17, 2012

(65) Prior Publication Data

US 2012/0267743 A1    Oct. 25, 2012

(30) Foreign Application Priority Data

Apr. 22, 2011    (JP) .................................. 2011-096169

(51) Int. Cl.
   *H01L 27/148*    (2006.01)

(52) U.S. Cl.
   USPC ........... 257/440; 257/443; 257/461; 257/458; 257/432; 257/E31.038; 257/E31.093; 257/E31.097; 257/E31.121

(58) Field of Classification Search
   USPC ......... 257/443, 440, 448, 461, 459, 458, 432, 257/434, E31.038, E31.093, E31.097, 257/E31.121
   See application file for complete search history.

(56) References Cited

U.S. PATENT DOCUMENTS

| | | | |
|---|---|---|---|
| 7,683,302 B2 * | 3/2010 | Yokozawa | 250/208.1 |
| 8,222,710 B2 * | 7/2012 | Hung et al. | 257/443 |
| 2006/0056047 A1 * | 3/2006 | Oshita | 359/680 |
| 2006/0077268 A1 | 4/2006 | Yokozawa | |
| 2006/0197097 A1 | 9/2006 | Mori | |
| 2007/0158772 A1 | 7/2007 | Boettiger | |
| 2010/0134663 A1 | 6/2010 | Yokozawa | |
| 2011/0233704 A1 * | 9/2011 | Yokozawa | 257/432 |

FOREIGN PATENT DOCUMENTS

| | | |
|---|---|---|
| JP | 03-282403 | 12/1991 |
| JP | 2001-237405 | 8/2001 |
| JP | 2006-108580 | 4/2006 |
| JP | 2006-245101 | 9/2006 |
| JP | 2009-523317 | 6/2009 |

\* cited by examiner

*Primary Examiner* — Michael Shingleton

(74) *Attorney, Agent, or Firm* — Panasonic Patent Center

(57) ABSTRACT

A solid-state imaging device and a method for manufacturing the same are provided. The solid-state imaging device includes a structure that provides a high sensitivity and high resolution without variations in spectral sensitivity and without halation of colors, and prevents light from penetrating into an adjacent pixel portion. A plurality of photodiodes are formed inside a semiconductor substrate. A wiring layer includes a laminated structure of an insulating film and a wire and is formed on the semiconductor substrate. A plurality of color filters are formed individually in a manner corresponding to the plurality of photodiodes above the wiring layer. A planarized film and a microlens are sequentially laminated on each of the color filters. In the solid-state imaging device, each of the color filters has an refraction index higher than that of the planarized film and has, in a Z-axis direction, an upper surface in a concave shape.

10 Claims, 11 Drawing Sheets

SOLID-STATE IMAGING DEVICE AND METHOD FOR MANUFACTURING THE SAME

BACKGROUND

1. Technical Field

The present invention relates to a solid-state imaging device and a method for manufacturing the same, and more particularly to a structure of color filters.

2. Background Art

A solid-state imaging device is used as an imaging device for a digital still camera, a video camera, or the like. The solid-state imaging device has a structure in which, for example, a plurality of photodiodes (light-receiving portions) is formed in a surface layer of one side of a semiconductor substrate, and each of the photodiodes performs photoelectric conversion and outputs image signals. Here, each of color filters for colors of red (R), green (G), and blue (B) is formed above each of the photodiodes, and therefore light having a light component of a wavelength band selected when the light passes through each of the color filters enters each of the photodiodes. As an example, a structure of a solid-state imaging device disclosed in Unexamined Japanese Patent Publication No. H03-282403 is described with reference to FIG. 11.

As illustrated in FIG. 11, color filters 903 are laminated on a semiconductor substrate in which a plurality of photodiodes (light-receiving portions) 901 are formed with a planarizing film 902 interposed therebetween. Adjacent color filters 903 are separated from each other by organosilicon material layer 904 inserted therebetween. Then, protective layer 905 is laminated on color filters 903 and organosilicon material layer 904.

Unexamined Japanese Patent Publication No. 1103-282403 describes that a solid-state imaging device having a high sensitivity and high resolution without variations in spectral sensitivity and without halation of colors can be provided by employing a structure for inserting organosilicon material layer 904 between adjacent color filters 903 as illustrated in FIG. 11.

SUMMARY

However, according to the solid-state imaging device proposed in Unexamined Japanese Patent Publication No. 1103-282403, there is a case in which light propagating obliquely after passing through a microlens enters an adjacent pixel portion and causes a problem of color mixture. Specifically, the microlens provided in each pixel portion in the solid-state imaging device is formed to collect incident light into a pixel center. For this reason, light made incident in a periphery portion of the pixel portion is refracted by the microlens and propagates in an oblique direction.

There may be a case where part of the light propagating in the oblique direction does not reach the photodiode of the corresponding pixel portion. In this case, the sensitivity is lowered. Further, due to miniaturization of a cell size, an allowable propagation angle of the light becomes smaller, which makes a light receivable range smaller.

In this case, if a curvature of the microlens is changed to arrange a position on which the light is collected in a region closer to the photodiode, a deviation of light path becomes larger. This makes the above-mentioned problem further noticeable.

Contrary to this, if the position on which the light is collected is arranged in a region closer to the microlens, the curvature of the lens should be made larger. When a pixel pitch becomes smaller due to the miniaturization of the cell size, incident light is totally reflected by a periphery portion of the lens and cannot be guided to the photodiode.

It is an object of the present invention to provide a solid-state imaging device and a method for manufacturing the solid-state imaging device having a structure that provides a high sensitivity and high resolution without variations in spectral sensitivity and without halation of colors, and prevents light from penetrating into an adjacent pixel portion.

The solid-state imaging device according to the present invention includes a semiconductor substrate, a wiring layer, a plurality of color filters, and an upper layer.

The semiconductor substrate includes a plurality of light-receiving portions which are formed therein and individually have photoelectric conversion functions. The wiring layer is formed on the semiconductor substrate and has a laminated structure of an insulating film and a wire. The plurality of color filters are formed, on the wiring layer, in a manner corresponding to the plurality of light-receiving portions individually. The upper layer is formed on the plurality of color filters and includes at least microlenses formed in a manner corresponding to the plurality of light-receiving portions individually.

In the solid-state imaging device according to the present invention, each of the color filters has a refraction index higher than a refraction index of a portion of the upper layer which makes contact with an upper surface of the color filter, and the upper surface of the color filter in a direction of lamination has a concave shape.

Further, the method for manufacturing a solid-state imaging device according to the present invention includes (i) a step of forming a plurality of light-receiving portions, (ii) a step of forming a wiring layer, (iii) a step of forming a plurality of color filters, and (iv) a step of forming an upper layer.

(i) In the step of forming the plurality of light-receiving portions, the plurality of light-receiving portions individually having photoelectric conversion functions are formed inside a semiconductor substrate.

(ii) In the step of forming the wiring layer, the wiring layer having a laminated structure of an insulating film and a wire is formed on the semiconductor substrate.

(iii) In the step of forming the plurality of color filters, the plurality of color filters are formed, on the wiring layer, in a manner corresponding to the plurality of light-receiving portions individually.

(iv) In the step of forming the upper layer, the upper layer including at least microlenses individually corresponding to the plurality of light-receiving portions is formed on the plurality of color filters.

In the method for manufacturing a solid-state imaging device according to the present invention, (iii) in the step of forming the color filters, the color filters are arranged to have a refraction index higher than a refraction index of a portion of the upper layer which makes contact with the upper surface of the color filter and to have the upper surfaces thereof, in the direction of lamination, in a concave shape.

In the solid-state imaging device according to the present invention, the refraction index of the color filter is higher than that of the portion of the upper layer which makes contact with the upper surface of the color filter, and the upper surface of the color filter is in a concave shape. Therefore, light that is refracted by the microlens and propagates obliquely is changed in its propagation direction downwardly in the direction of lamination by an interface (upper surface) between the upper layer and the color filter. Accordingly, the solid-state imaging device has a high sensitivity and high resolution without variations in spectral sensitivity and without halation of colors, and can prevent light from penetrating into an adjacent pixel portion.

Further, in the solid-state imaging device according to the present invention, (iii) in the step of forming the color filters, the color filters are arranged to have a refraction index higher than a refraction index of a portion of the upper layer which makes contact with the upper surface of the color filter and to have the upper surfaces thereof, in the direction of lamination, in a concave shape. With this structure, it is possible to form a solid-state imaging device having a similar effect as described above.

In the solid-state imaging device and the method for manufacturing the same, for example, variations as described below can be adopted.

In the solid-state imaging device according to the present invention, it is possible to adopt a structure in which a partition wall is inserted between adjacent color filters, and the color filter has an refraction index higher than that of the partition wall. With this structure, light that propagates from one color filter toward an adjacent color filter is reflected by an interface between the color filter and the partition wall, and therefore it is possible to prevent the light from penetrating into the adjacent pixel portion.

In the solid-state imaging device according to the present invention, it is possible to adopt a structure in which each of the partition walls has side faces that are inclined so that a section width of the partition wall gradually increases from an upper side to a lower side in a direction of lamination. With this structure, light that propagates through the microlens is effectively collected in the light-receiving portion of the semiconductor substrate. Accordingly, the device has a high sensitivity and a high resolution.

In the solid-state imaging device according to the present invention, it is possible to adopt a structure in which a portion of the upper surface of the color filter which is most depressed is positioned lower than a top of the partition wall in the direction of lamination. This structure makes it difficult for light whose propagation direction is changed at the upper surface of the color filter to leak into an adjacent pixel portion. Accordingly it is possible to prevent light from penetrating into an adjacent pixel portion.

In the solid-state imaging device according to the present invention, it is possible to adopt a structure in which a lower surface, in the direction of lamination, of the color filter also has a concave shape. With this structure, light is also caused to refract at the lower surface of the color filter, which is excellent in view of collecting light into the light-receiving portion.

In the solid-state imaging device according to the present invention, it is possible to adopt a structure in which the wiring layer has recesses in positions individually corresponding to above the plurality of light-receiving portions, and a second insulating film having a refraction index higher than a refraction index of the insulating film of the wiring layer is buried inside each of the recesses. With this structure, the second insulating film serves as a core portion of a light waveguide, and collected light is prevented from leaking into the insulating film of the wiring layer but can be reliably guided to the light-receiving portion.

In the solid-state imaging device according to the present invention, it is possible to adopt a structure in which the color filters are formed with a thickness of at least 400 nm. Also, in the solid-state imaging device according to the present invention, it is possible to adopt a structure in which an amount of a depression of the concave shape of the upper surface of each of the color filters is 50 nm or larger and 200 nm or smaller.

In the method for manufacturing a solid-state imaging device according to the present invention, it is possible to adopt a structure in which lower surfaces of the color filters in the direction of lamination are also arranged in a concave shape in the step of forming the color filters. With this structure, the lower surfaces of the color filters also have a concave shape, which is excellent in view of collecting light.

It should be noted that the foregoing effects can be obtained when the color filter has a refraction index that is higher than a refraction index of a portion of the wiring layer located under the color filter, which makes contact with the lower surface of the color filter. Contrary to this, if the relation of the two refraction indices is reversed, a similar effect can be obtained by arranging the lower surface of the color filter in a convex shape.

In the method for manufacturing a solid-state imaging device according to the present invention, a step of forming, on the wiring layer, partition walls in a grid pattern with openings provided in positions individually corresponding to above the plurality of light-receiving portions subsequent to the step of forming the wiring layer but prior to the step of forming the plurality of color filters. Then, it is possible to adopt a structure in which, in the step of forming the plurality of color filters, each of the color filters is formed in each of the openings opened in each of the partition walls. With this structure, adjacent color filters are divided by the partition wall, and it is therefore possible to manufacture a solid-state imaging device excellent in preventing light from penetrating into an adjacent pixel portion.

In the method for manufacturing a solid-state imaging device according to the present invention, it is possible to adopt a structure in which, in the step of forming the wiring layer, recesses are provided in positions individually corresponding to above the plurality of light-receiving portions. Further, it is also possible to adopt a structure in which, subsequent to the step of forming the wiring layer but prior to the step of forming the plurality of color filters, there is provided a step of burying a second insulating film having a refraction index higher than a refraction index of the insulating film of the wiring layer inside each of the recesses. With this structure, it is possible to manufacture a solid-state imaging device in which the second insulating film serves as a core portion of a light waveguide, and collected light is prevented from leaking into the insulating film of the wiring layer but can be reliably guided to the light-receiving portion.

DETAILED DESCRIPTION OF THE PREFERRED EMBODIMENT

Hereinafter, exemplary embodiments according to the present invention will be described with reference to the drawings. Each of the exemplary embodiments described hereinafter is an example for describing the constituent features of the present invention and working and effect provided therefrom in an easy-to-understand manner, and therefore the present invention, other than those that are essential features, is not limited to the exemplary embodiments described hereinafter.

First Exemplary Embodiment

1. Overall Configuration of Solid-State Imaging Device 1

An overall configuration of solid-state imaging device 1 according to the first exemplary embodiment will be described with reference to FIG. 1.

Figure 1:
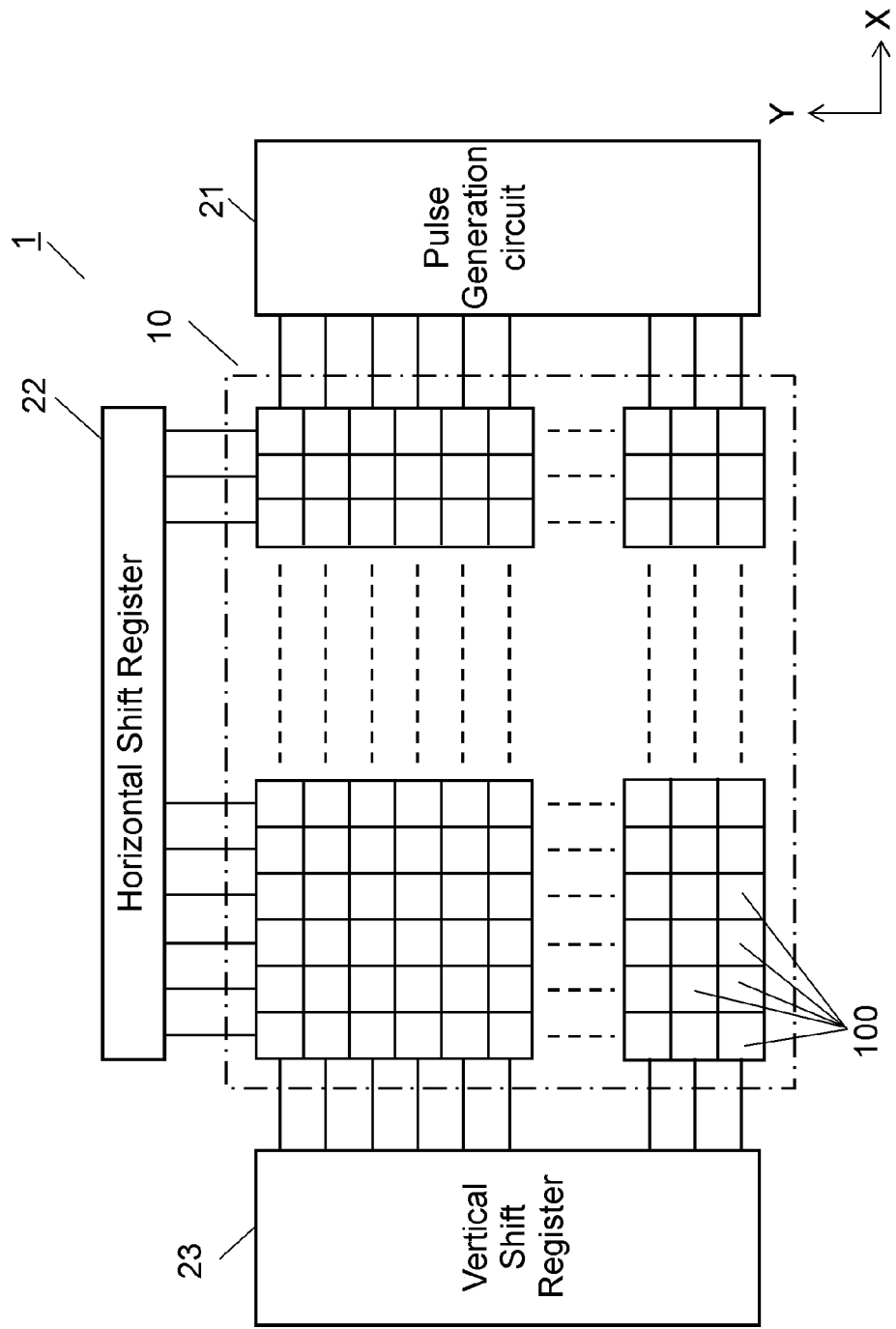
FIG. 1 shows a schematic block diagram illustrating an overall configuration of solid-state imaging device 1 according to a first exemplary embodiment of the present invention.

As illustrated in FIG. 1, in solid-state imaging device 1 according to the first exemplary embodiment, a plurality of pixel portions 100 are arranged in a matrix form along an X-Y plane to thereby form pixel region 10. Pulse generation circuit 21, horizontal shift register 22, and vertical shift register 23, which are arranged on a periphery of pixel region 10 are connected to pixel region 10. Horizontal shift register 22 and vertical shift register 23 sequentially output driving pulses to each of pixel portions 100 in response to a timing pulse from pulse generation circuit 21.

2. Structure of Pixel Portions 100 of Solid-State Imaging Device 1

Structure of pixel portions 100 of solid-state imaging device 1 will be described with reference to FIG. 2.

Figure 2:
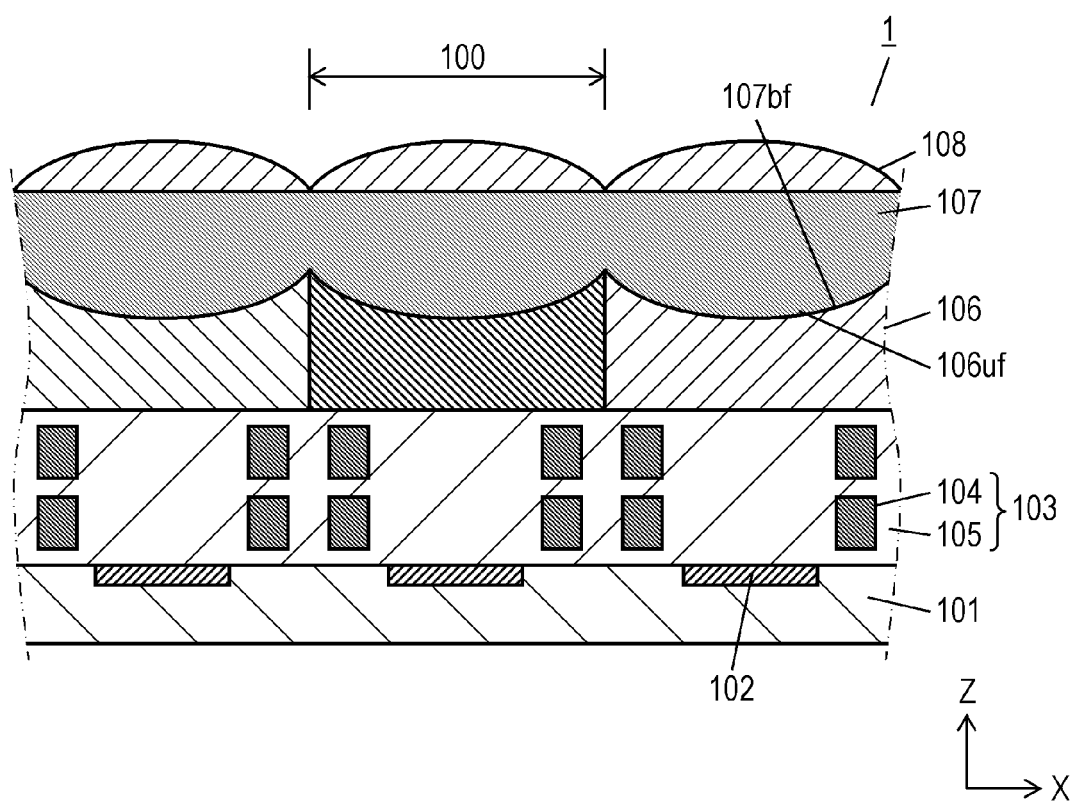
FIG. 2 shows a schematic cross sectional view illustrating a structure of pixel portion 100 of solid-state imaging device.

As illustrated in FIG. 2, in solid-state imaging device 1, a plurality of photodiodes 102 are formed in a surface layer of one principal surface of semiconductor substrate 101. Each of photodiodes 102 is provided in a manner corresponding to each of pixel portions 100. Although photodiodes 102 serving as light-receiving portions are structured by a p-n junction between a charge accumulation layer and a surface layer, the detailed structure thereof is omitted from the illustration. Further, in solid-state imaging device 1, although floating diffusion (FD) and transistor elements are also formed in semiconductor substrate 101, they are also omitted from the illustration.

Wiring layer 103 is formed on semiconductor substrate 101. Wiring layer 103 has a laminated structure of insulating film 105 with a plurality of layers and wire 104 with a plurality of layers. Wire 104 of wiring layer 103 is formed through, for example, damascene process, and is a copper (Cu) wire, for example. Wire 104 is a fine wire having a width of, for example, 80 nm to 130 nm. Although a gate insulating film is formed between semiconductor substrate 101 and wiring layer 103, the gate insulating film is omitted from the illustration in FIG. 2.

Insulating film 105 of wiring layer 103 is formed of, for example, silicon oxide ($SiO_2$), and, for example, a film thickness per layer is about 300 nm. In addition, a refraction index of insulating film 105 is, for example, about 1.45.

Color filters 106 are formed individually for pixel portions 100 on wiring layer 103. Color filters 106 of R, G, and B colors are arranged next to each another (so-called Bayer pattern).

A surface (upper surface) 106$uf$ located on an upper side of color filter 106 in a Z-axis direction has a concave shape with a largest depression at a center in each of pixel portions 100. A maximum thickness of color filter 106 is, for example, about 500 nm to 700 nm, and a depression amount of upper surface 106$uf$ is, for example, 50 nm to 200 nm. Also, color filter 106 is formed by using a pigment dispersant resist, and has a refraction index of about 1.6 to 1.7.

Microlens 108 is formed on color filter 106 with planarized film 107 interposed therebetween. Planarized film 107 makes contact, through lower surface 107$bf$, with upper surface 106$uf$ of color filter 106. Planarized film 107 is formed of a thermo-setting resin having an acrylic resin as a main component, and has a film thickness of about 200 nm to 600 nm. In addition, a refraction index of planarized film 107 is, for example, about 1.5.

Microlens 108 is also formed of a thermo-setting resin having an acrylic resin as a main component, and has a maximum film thickness of about 400 nm to 600 nm. Also, microlens 108 has a refraction index of about 1.5.

As illustrated in FIG. 2, solid-state imaging device 1 according to this exemplary embodiment has a structure in which color filter 106 is formed directly on wiring layer 103. However, it is also possible to interpose a transparent planarized film having a high optical transmittance between wiring layer 103 and color filter 106.

3. Incident Path of Light in Solid-State Imaging Device 1

Incident path of light in solid-state imaging device 1 will be described with reference to FIG. 3.

Figure 3:
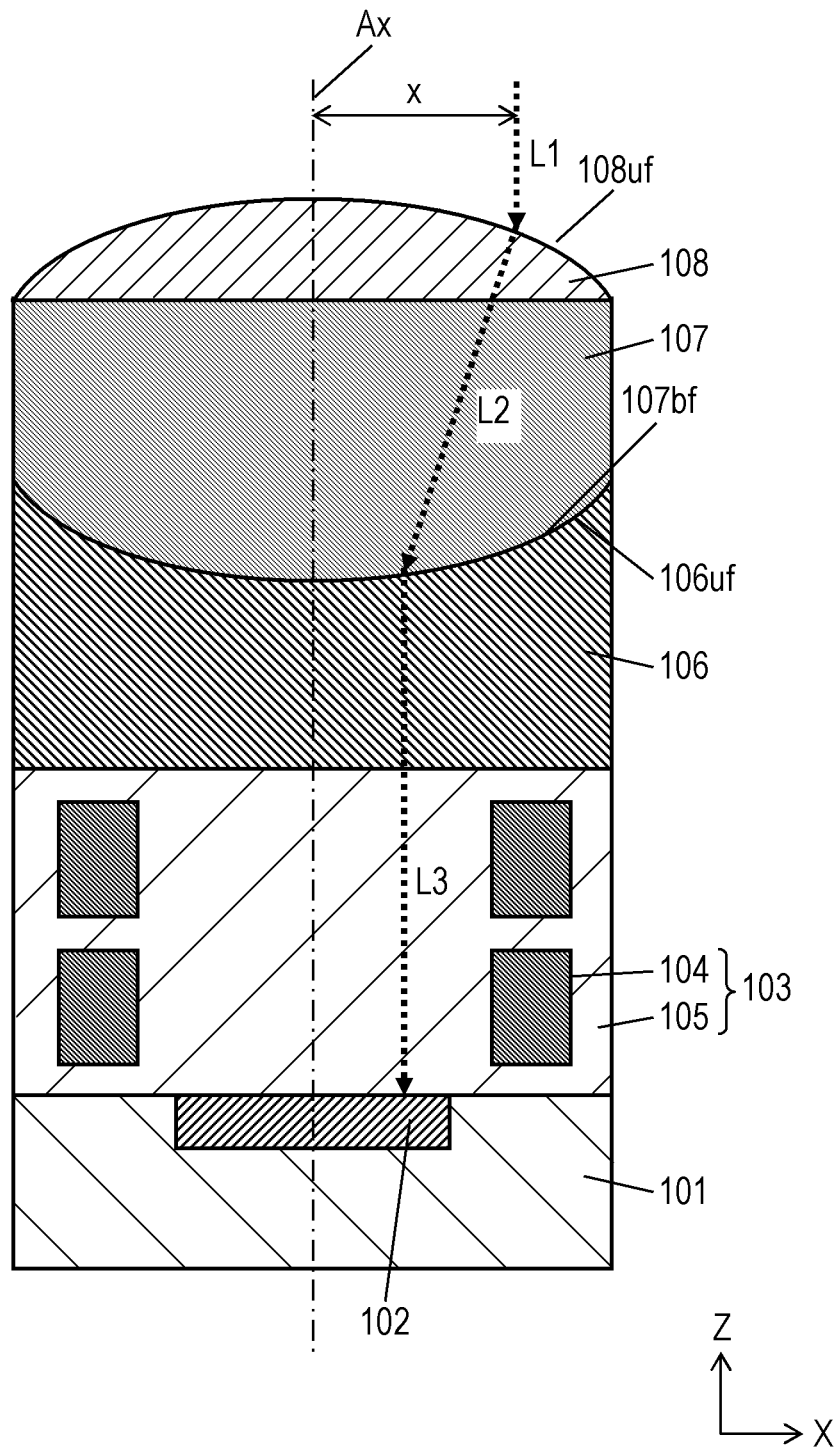
FIG. 3 shows a schematic cross sectional view illustrating a path of incident light in solid-state imaging device 1.

First, as illustrated in FIG. 3, although upper surface 106$uf$ of color filter 106 in solid-state imaging device 1 according to this exemplary embodiment has a concave shape, a center of curvature thereof and a center of curvature of upper surface 108$uf$ of microlens 108 are arranged on an identical axis (center axis Ax).

Light L1 incident on a position away from center axis Ax by a distance x in an X-axis direction changes a propagation angle thereof at upper surface 108$uf$ of microlens 108 by a function of the curvature thereof and a refraction index of microlens 108 (light L2). Here, since microlens 108 is designed to have a focal point away from microlens 108 by a certain distance, light L2 propagates toward the center of curvature of upper surface 108$uf$ of microlens 108.

Light L2 propagates in planarized film 107 and reaches a boundary surface between lower surface 107$bf$ of planarized film 107 and upper surface 106$uf$ of color filter 106. During this process, the upper surface of color filter 106 is in a concave shape. Further, if it is assumed that a refraction index of planarized film 107 is λ107, and a refraction index of color filter 106 is λ106, the following relation is satisfied.

$$\lambda 107 < \lambda 106$$

Due to the above-mentioned relation, light L2 changes the propagation direction at upper surface 106uf of color filter 106 to a downward direction (light L3) in the Z-axis direction. To state it differently, light L3 propagates in a direction in which an angle relative to center axis Ax becomes smaller than that of light L2. Here, considering a difference between refraction indices of color filter 106 and planarized film 107, it is preferable that the curvature of upper surface 106uf of color filter 106 be set so that light L3 propagates downwardly in the Z-axis direction. However, it serves the purpose if the collected light finally enters photodiode 102 even if the light does not become perfectly parallel to the Z-axis.

Figure 11:
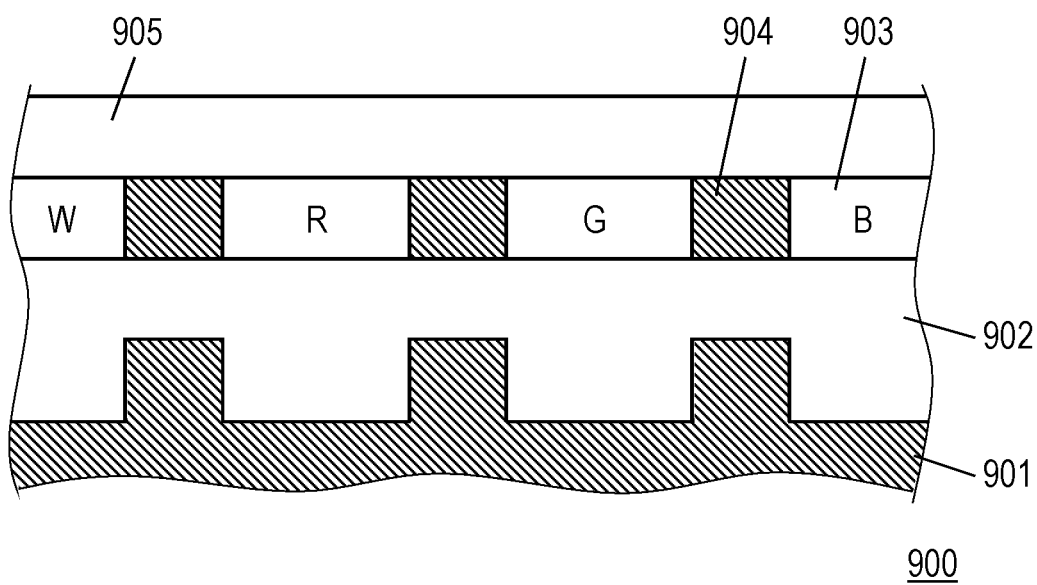
FIG. 11 shows a cross sectional view illustrating a structure of a pixel portion of a solid-state imaging device according to a related art.

To summarize the foregoing, light L1 that enters microlens 108 changes its propagation direction at upper surface 108uf of microlens 108 in an oblique direction and passes through microlens 108 and planarized film 107 (light L2). Thereafter, a direction of light L2 that reaches the boundary surface between upper surface 106uf of color filter 106 and lower surface 107bf of planarized film 107 is changed to a direction (downward in the Z-axis direction) in which an angle made relative to center axis Ax becomes small (light L3), and enters photodiode 102. With this arrangement, in solid-state imaging device 1 according to this exemplary embodiment, it is possible to allow the light to enter photodiode 102 in a more stable manner than in the solid-state imaging device according to the related art as illustrated in FIG. 11, and improve the sensitivity characteristic. To state it differently, it is possible to allow the light to reliably enter photodiode 102 despite variations in a film thickness of wiring layer 103 and variations in dimensions and film qualities of other components caused by variations during manufacturing.

4. Manufacturing Method

A method for manufacturing solid-state imaging device 1 according to this exemplary embodiment will be described with reference to FIGS. 4A to 6B. Hereinafter, only a portion of pixel region 10 which is a feature of solid-state imaging device 1 according to this exemplary embodiment will be described.

Figure 4A:
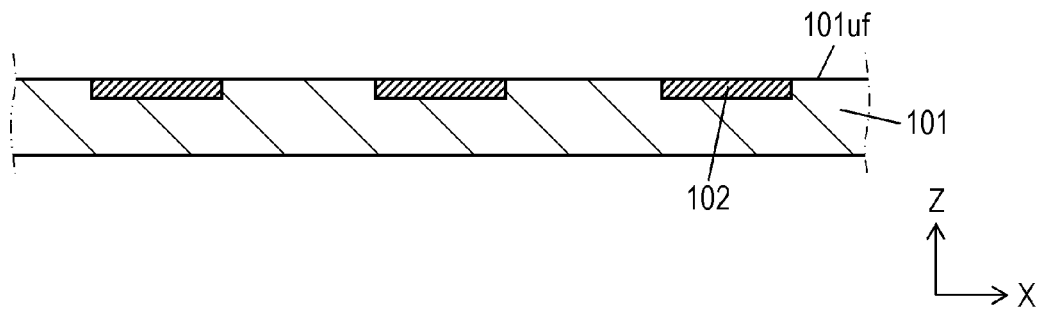
FIG. 4A shows a schematic cross sectional view of solid-state imaging device 1 in a manufacturing process.

First, as illustrated in FIG. 4A, a plurality of photodiodes 102 are formed in a surface layer on a side of one principal surface (upper surface) 101uf of semiconductor substrate 101. Semiconductor substrate 101 is, for example, a silicon substrate, and photodiodes 102 are formed by performing ion implantation of impurities such as boron (B), phosphor (P), or arsenic (As) from a side of upper surface 101uf of semiconductor substrate 101. Photodiodes 102 are structured by a p-n junction between an n-type charge-injection layer and p+ type surface layer (detailed illustration is omitted), and, for example, when a cell size is 1.4 μm, a width of photodiode 102 is 0.7 μm.

When semiconductor substrate 101 is viewed in plan view from above in the Z-axis direction, the plurality of photodiodes 102 are arranged in a matrix form.

Thereafter, gate electrodes or the like for transferring charges are formed after a gate insulating film is formed (omitted in the illustration). Formation of photodiodes 102, the gate electrodes, or the like is performed by arbitrarily using a common photolithography process, ion implantation process, film formation process, and thermal diffusion process.

Figure 4B:
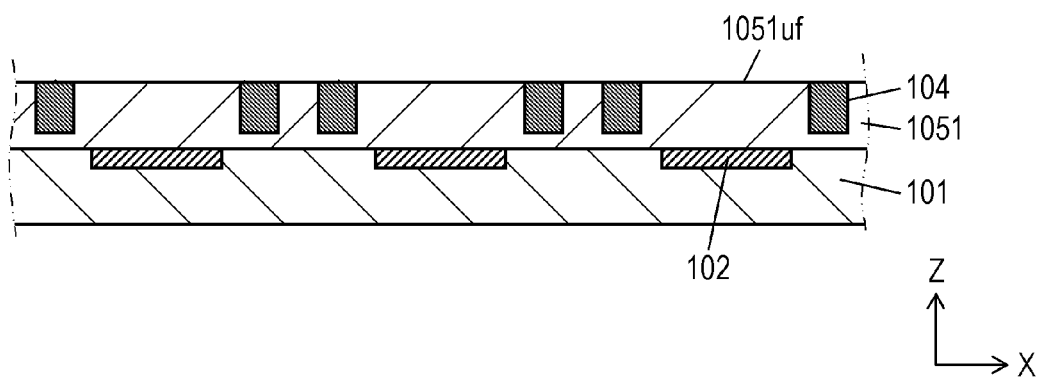
FIG. 4B shows a schematic cross sectional view of solid-state imaging device 1 in a manufacturing process.

As illustrated in FIG. 4B, insulating film 1051 is laminated on semiconductor substrate 101, and wire 104 is formed from upper surface 1051uf of insulating film 1051 toward inside (downward in the Z-axis direction). If a common damascene interconnection process is performed, formation of wire 104 involves, after laminating insulating film 1051, forming grooves by applying a lithography process and an etching process to portions where wire 104 is to be formed. Next, copper (Cu) is buried in the grooves, and CMP (Chemical Mechanical Polishing) process or the like is performed.

Figure 4C:
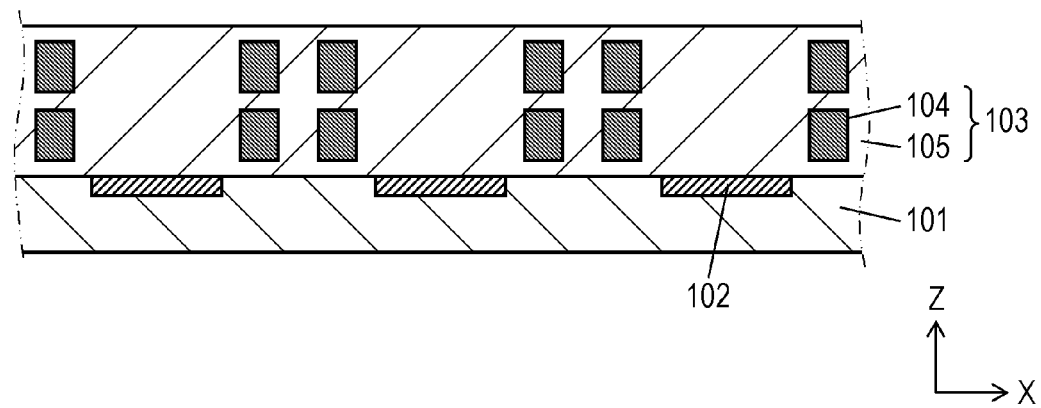
FIG. 4C shows a schematic cross sectional view of solid-state imaging device 1 in a manufacturing process.

As illustrated in FIG. 4C, wiring layer 103 including laminated structure of a plurality of insulating films 105 and a plurality of wires 104 is formed by repeating the processes as described above. There may be a case in which a process for planarizing a base using a transparent resin after wiring layer 103 is formed and before color filter 106 is formed. If such a process is performed an effect in which adhesion between wiring layer 103 and color filter 106 is made stronger is provided in addition to the effect in which the film made of the transparent resin planarizes the base. If such an effect is taken into consideration, it is possible to form the film made of the transparent resin by evaporating, for example, an epoxy resin or HMDS (hexamethyldisilazane).

Figure 5A:
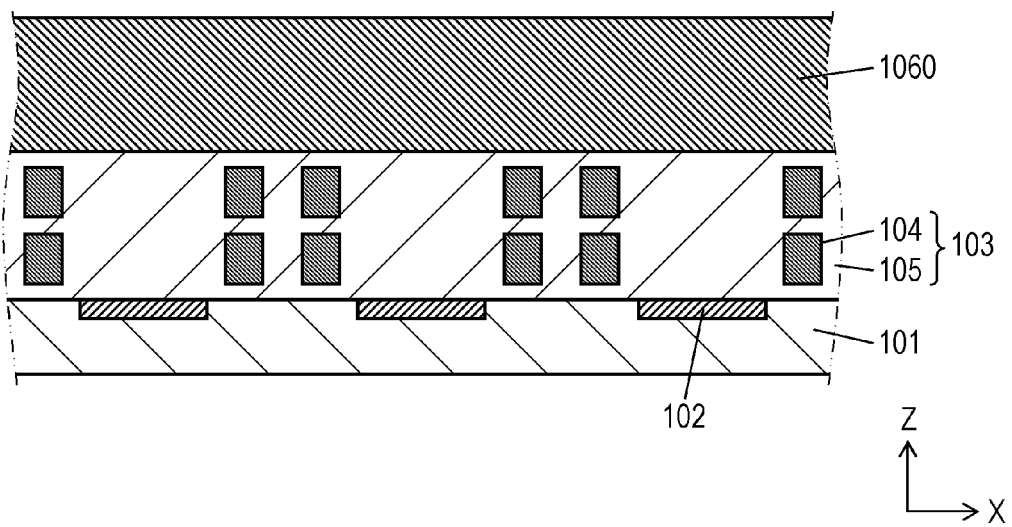
FIG. 5A shows a schematic cross sectional view of solid-state imaging device 1 in a manufacturing process.

Next, as illustrated in FIG. 5A, color filter preparation film 1060 is laminated on wiring layer 103. Color filter preparation film 1060 can be formed by coating a pigment dispersant resist on wiring layer 103.

Figure 5B:
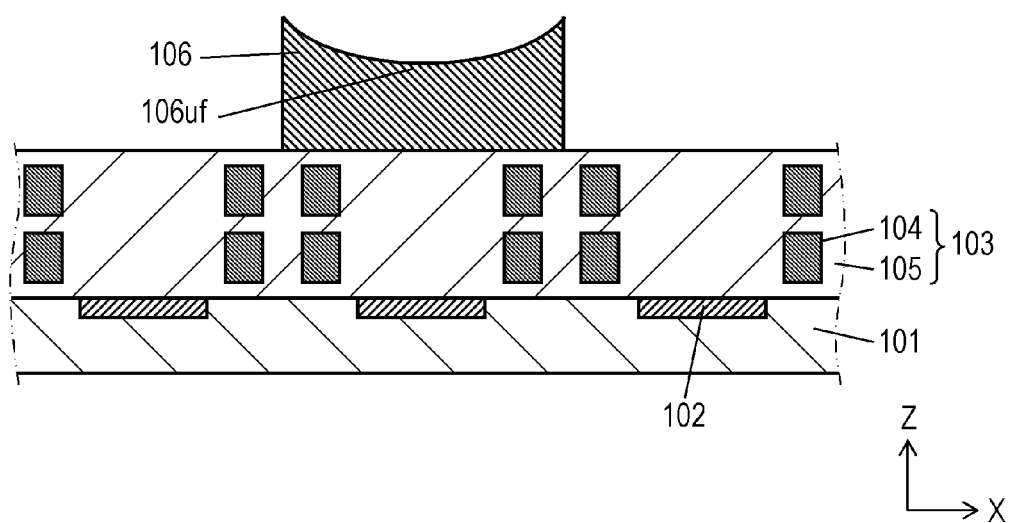
FIG. 5B shows a schematic cross sectional view of solid-state imaging device 1 in a manufacturing process.

Thereafter, an ultraviolet ray is emitted to color filter preparation film 1060 through a photomask, and thereby the resist is selectively exposed. In this case, it is possible to make upper surface 106uf of color filter 106 in a concave shape by using a so-called gray-scale mask in which transmittance of an ultraviolet ray is different within a single filter for a portion by which the resist is to be left (see FIG. 5B). Specifically, in the case where a negative type resist is used, by arranging transmittance of an ultraviolet ray lower in a portion of a mask corresponding to a center of color filter 106 than that of peripheral portion and gradually increasing the transmittance higher toward the peripheral portion, it is possible to realize the shape of upper surface 106uf of color filter 106 as illustrated in FIG. 5B.

Figure 6A:
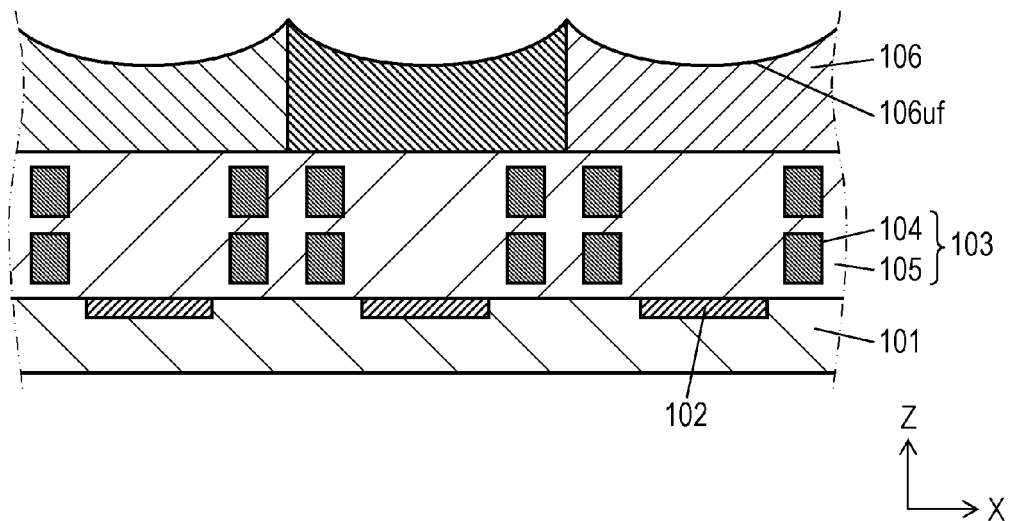
FIG. 6A shows a schematic cross sectional view of solid-state imaging device 1 in a manufacturing process.

As illustrated in FIG. 6A, by repeating the coating of the above mentioned negative type resist and the exposure through the gray-scale mask, it is possible to form color filters 106 corresponding to all pixel portions 100.

In this exemplary embodiment, all of upper surfaces 106uf of color filters 106 in all pixel portions 100 are arranged to have an identical curvature. However, the curvature may be changed for individual colors of color filters 106 or individual regions (for example, a center of the chip and an outer edge of the chip) in the chip.

Figure 6B:
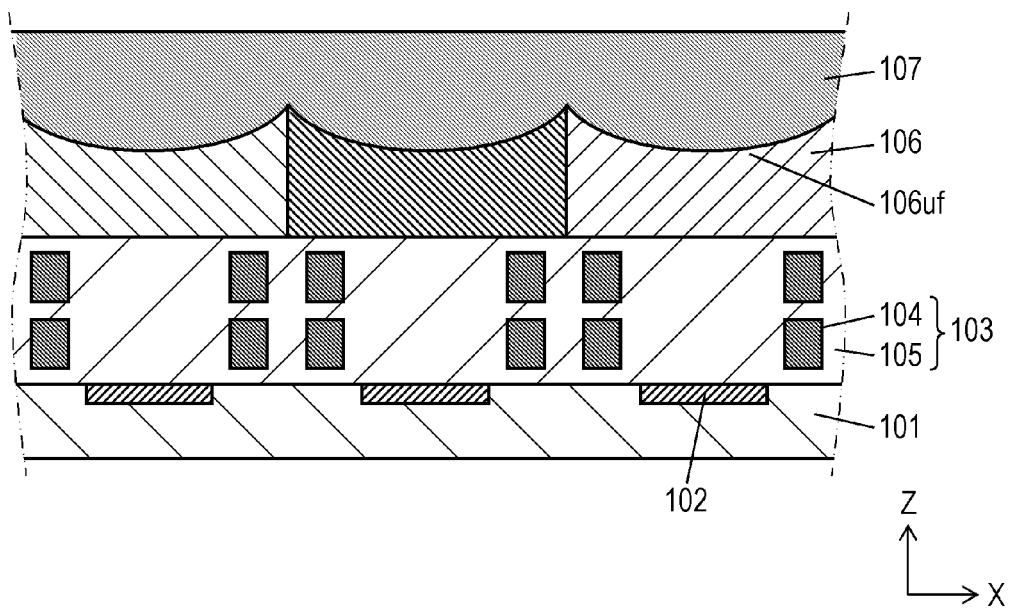
FIG. 6B shows a schematic cross sectional view of solid-state imaging device 1 in a manufacturing process.

Thereafter, as illustrated in FIG. 6B, planarized film 107 is formed on color filters 106 by using a thermo-setting resin having an acrylic resin as a main component, and the microlenses are formed by also using a thermo-setting resin having an acrylic resin as a main component (not illustrated).

Second Exemplary Embodiment

Figure 7:
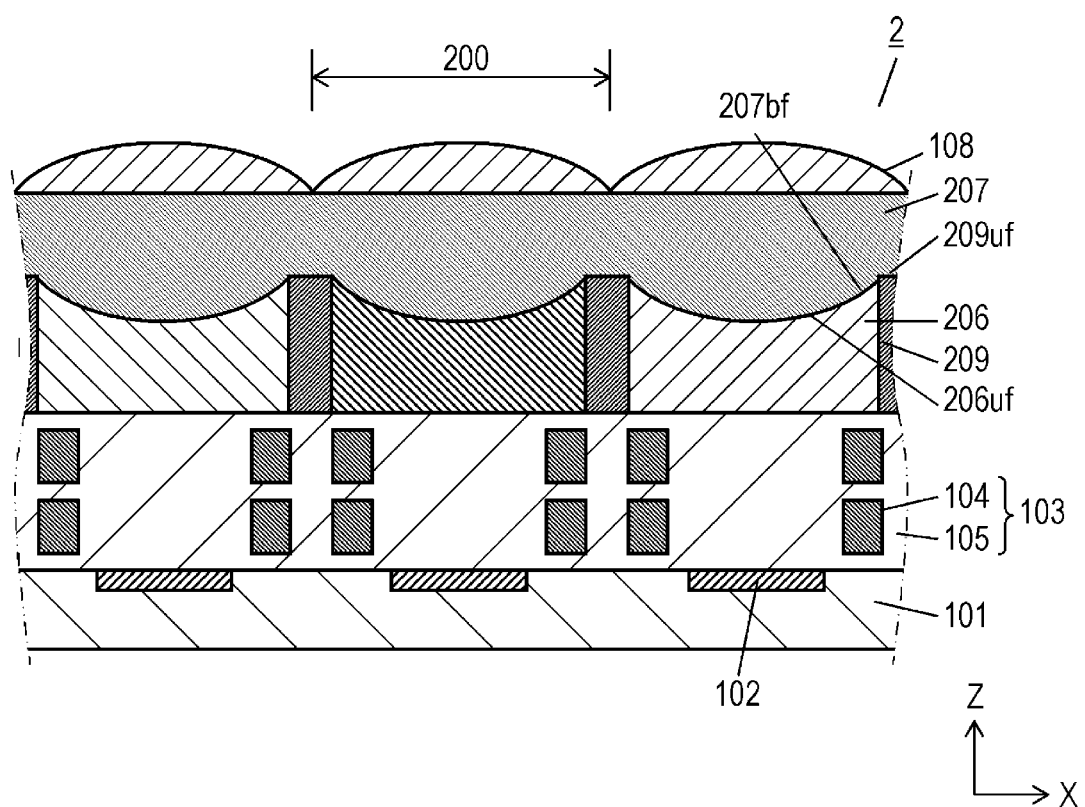
FIG. 7 shows a schematic cross sectional view of a structure of pixel portion 200 of solid-state imaging device 2 according to a second exemplary embodiment of the present invention.

A structure of solid-state imaging device 2 according to a second exemplary embodiment will be described with reference to FIG. 7. FIG. 7 illustrates a part of pixel portions 200 in a pixel region taken out from the structure of solid-state imaging device 2, and structures other than that of the pixel region are the same as those in the first exemplary embodiment. Also, in the description hereinafter, descriptions of the structures similar to those of the first exemplary embodiment will not be repeated.

As illustrated in FIG. 7, in solid-state imaging device 2 according to this exemplary embodiment, partition walls 209 are interposed between color filters 206 of adjacent pixel portions 200. Then, color filters 206 are individually formed between adjacent partition walls 209, and upper surfaces 206*uf* of the color filters 206 have a concave shape as in the case of the first exemplary embodiment.

Planarized film 207 on color filter 206 has its lower surface 207*bf* making contact with upper surface 206*uf* of color filter 206 as in the case of the foregoing, but also makes contact with top surface 209*uf* of partition wall 209 without providing gaps therebetween.

Here, partition walls 209 are in a grid pattern viewed in plan view from above in the Z-axis direction. Then, partition walls 209 are formed of a CVD film (TEOS film) using, for example, TEOS (Tetra Ethyl Ortho Silicate) as a raw material. A refraction index of the partition walls 209 is about 1.4 to 1.5 which is smaller than the refraction index of color filters 206.

In solid-state imaging device 2 according to this exemplary embodiment, partition walls 209 are individually interposed between color filters 206 in addition to the structure of solid-state imaging device 1 according to the first exemplary embodiment. With this arrangement, in solid-state imaging device 2 according to this exemplary embodiment, even if part of light collected by microlens 108 is about to leak from a side surface of color filter 206 into color filter 206 of adjacent pixel portion 200, the light is reflected by an interface between color filter 206 and partition wall 209. This is because a refraction index of color filter 206 is larger than a refraction index of partition wall 209.

More specifically, when light incident on a position away from a center of each of pixel portions 200 is refracted by microlens 108 and upper surface 206*uf* of color filter 206, angles to be refracted vary. For this reason, there is a case in which light propagates at an angle by which the light cannot enter photodiode 102. However, such light is reflected or multiply-reflected by the interface between color filter 206 and partition wall 209 inserted between color filters 206, and enters photodiode 102.

There is also a case in which not only light vertically incident but also light obliquely incident on a surface of semiconductor substrate 101 make incident on a position away from a center of pixel portion 200. Therefore, such light is not sufficiently refracted by microlens 108 and upper surface 206*uf* of color filter 206 and is about to penetrate into color filter 206 of adjacent pixel portion 200. However, due to the reflection by the interface between color filter 206 and partition wall 209, the light is reliably made incident on photodiode 102 of predetermined pixel portion 200.

As described above, according to solid-state imaging device 2 of this exemplary embodiment, leakage of light to adjacent pixel portion 200 can be reliably prevented by creating partition walls 209 individually between color filters 206, in addition to the effect provided solid-state imaging device 1 according to the first exemplary embodiment.

Third Exemplary Embodiment

Figure 8:
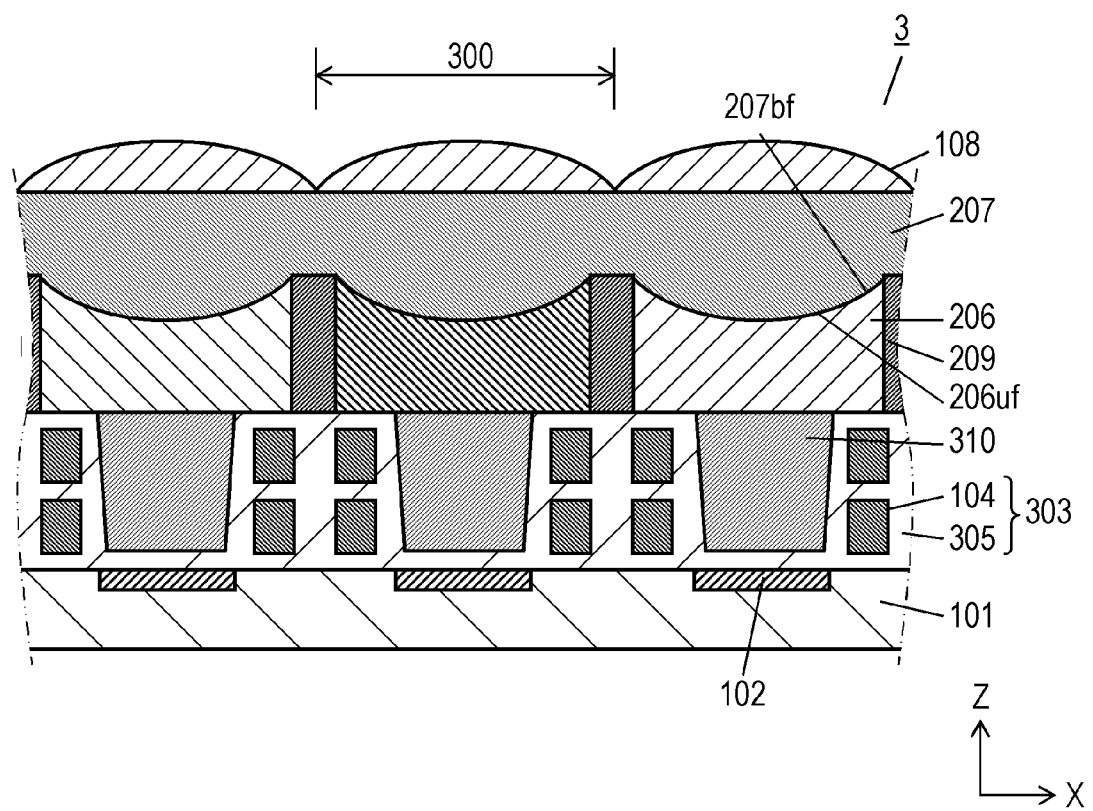
FIG. 8 shows a schematic cross sectional view of a structure of pixel portion 300 of solid-state imaging device 3 according to a third exemplary embodiment of the present invention.

A structure of solid-state imaging device 3 according to a third exemplary embodiment will be described with reference to FIG. 8. FIG. 8 illustrates a part of pixel portions 300 in a pixel region taken out from the structure of solid-state imaging device 3, and structures other than that of the pixel region are the same as those in the first and second exemplary embodiments. Also, in the description hereinafter, descriptions of the structures similar to those of the first and second exemplary embodiments will not be repeated.

As illustrated in FIG. 8, in solid-state imaging device 3 according to this exemplary embodiment, a recess is formed in insulating film 305 of wiring layer 303 at a position above photodiode 102 in each of pixel portions 300. Then, insulating film (core portion) 310 is buried in the recess opened in insulating film 305 of wiring layer 303. Core portion 310 is formed of, for example, silicon nitride (SiN) and has a refraction index of about 1.9 to 2.0 which is higher than that of insulating film 305 of wiring layer 303. By forming core portion 310 by burying it in the recess opened in insulating film 305 of wiring layer 303 in this way, a light waveguide is formed between color filter 206 and semiconductor substrate 101.

In solid-state imaging device 3 according to this exemplary embodiment, even if an incident angle of light is not vertical relative to photodiode 102 due to variations when the incident light passes through color filter 206 and propagates toward photodiode 102, the light is guided toward photodiode 102 by the light waveguide formed by core portion 310 and insulating film 305 therearound. Accordingly, in solid-state imaging device 3 according to this exemplary embodiment, it is possible to further obtain an effect of high sensitivity characteristic in addition to the effects provided by solid-state imaging devices 1 and 2 according to the first and second exemplary embodiments.

In solid-state imaging device 3 according to this exemplary embodiment, a curvature of a concave shape of upper surface 206*uf* of color filter 206 can be changed for each color of color filter 206 or each region inside the chip. With this arrangement, an identical characteristic can be obtained for each color or each region.

Further, solid state imaging device 3 according to this exemplary embodiment also takes an example of a structure in which a center of curvature of an upper surface of microlens 108 and a center of curvature of upper surface 206*uf* of microlens 206 are arranged on an identical axis (center axis Ax of pixel portion 300). However, it is also possible to deviate the centers of curvatures of both in a direction crossing the Z-axis direction. For example, the incident angles of light in the center and peripheral portion of the chip may become different from each other. However, in such a case, it is also possible to deviate the centers of curvatures from each other and thereby change an incident angle characteristic so that the incident angle characteristics in the center and peripheral portion of the chip are made identical with each other.

Fourth Exemplary Embodiment

Figure 9:
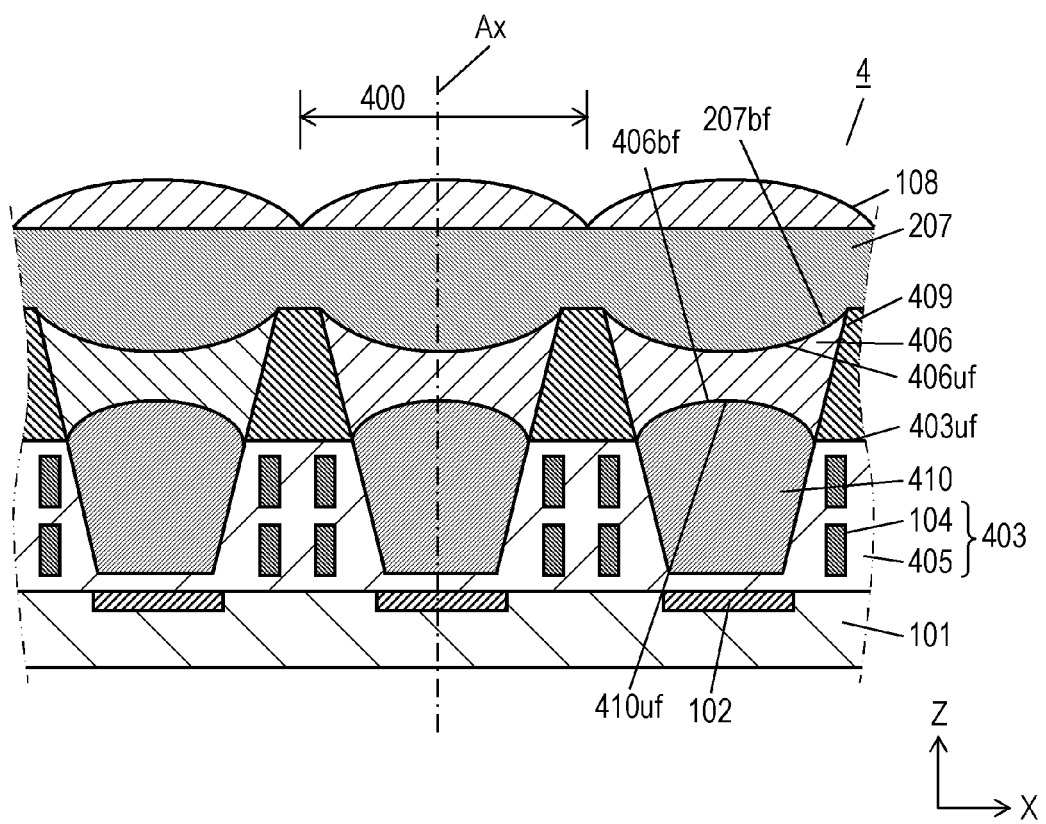
FIG. 9 shows a schematic cross sectional view of a structure of pixel portion 400 of solid-state imaging device 4 according to a fourth exemplary embodiment of the present invention.

A structure of solid-state imaging device 4 according to a fourth exemplary embodiment will be described with reference to FIG. 9. FIG. 9 illustrates a part of pixel portions 400 in a pixel region taken out from the structure of solid-state imaging device 4, and structures other than that of the pixel region are the same as those in the first, second, and third exemplary embodiments. Also, in the description hereinafter, descriptions of the structures similar to those of the first, second, and third exemplary embodiments will not be repeated.

As illustrated in FIG. 9, in solid-state imaging device 4 according to this exemplary embodiment, lower surface 406*bf* of color filter 406 in each pixel portion 400 also has a concave shape. Then, as in the case of solid-state imaging device 3 according to the third exemplary embodiment, core portion 410 is formed below color filter 406. In solid-state imaging device 4 according to this exemplary embodiment, upper surface 410*uf* of core portion 410 has an upward convex shape, and a top thereof is positioned above upper surface 403*uf* of insulating film 405 of wiring layer 403 in the Z-axis direction.

Further, as illustrated in FIG. 9, partition wall 409 in solid-state imaging device 4 has a trapezoidal shape in cross section of which a width becomes wider as a position thereof moves from an upper side toward a down side in the Z-axis direction Materials or the like forming partition wall 409, core portion 410, and the like are the same as those used in the third exemplary embodiment.

In solid-state imaging device 4 structured as described above, in addition to the effects provided by solid-state imaging devices 1, 2, and 3 of the first, second, and third exemplary embodiments, light reflected by a side surface of partition wall 409 is guided further to a center of pixel portion 400 because the side surface of partition wall 409 is an inclined surface.

In addition, since upper surface 410$uf$ of core portion 410 has the upward convex shape, and a refraction index of core portion 410 is higher than a refraction index of color filter 406, an interface therebetween also functions as a light collecting lens. Accordingly, it is possible to further improve the sensitivity characteristic according to solid-state imaging device 4 of this exemplary embodiment.

In this exemplary embodiment, a curvature of a concave shape of upper surface 406$uf$ of color filter 406 and a curvature of upper surface 410$uf$ of core portion 410 can also be changed for each color of color filter 406 or each region inside the chip. With this arrangement, an identical characteristic can be obtained for each color or each region.

Further, this exemplary embodiment also takes an example of a structure in which a center of curvature of an upper surface of microlens 108, a center of curvature of upper surface 406$uf$ of microlens 406, and a center of curvature of upper surface 410$uf$ of core portion 410 are arranged on an identical axis (center axis Ax of pixel portion 400). However, it is also possible to deviate these centers of curvatures in a direction crossing the Z-axis direction.

Fifth Exemplary Embodiment

Figure 10:
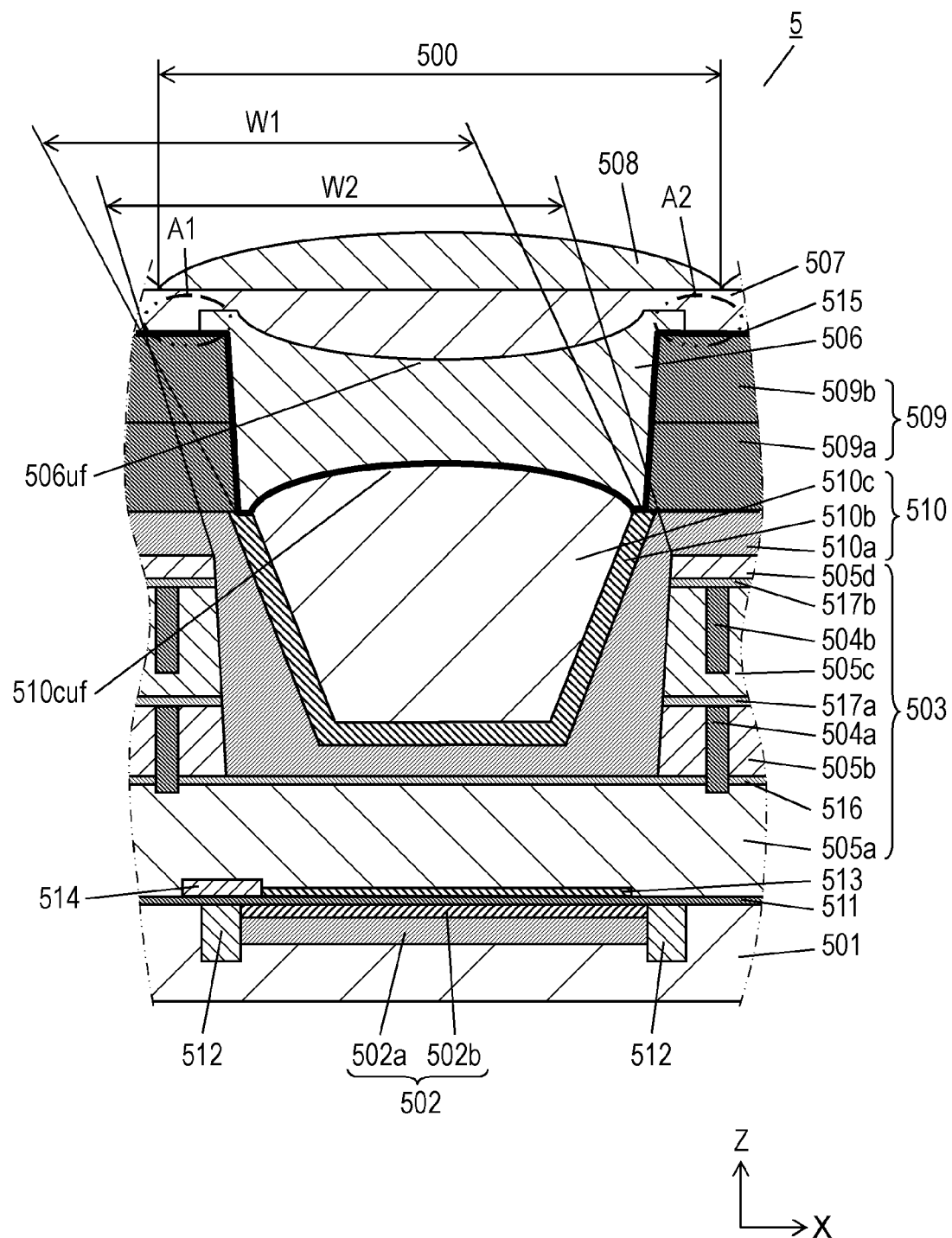
FIG. 10 shows a schematic cross sectional view of a structure of pixel portion 500 of solid-state imaging device 5 according to a fifth exemplary embodiment of the present invention.

A structure of solid-state imaging device 5 according to a fifth exemplary embodiment will be described with reference to FIG. 10. FIG. 10 illustrates a part of pixel portions 500 in a pixel region taken out from the structure of solid-state imaging device 5, and structures other than that of the pixel region are the same as those in the first, second, third, and fourth exemplary embodiments. Also, in the description hereinafter, descriptions of the structures similar to those of the first, second, third, and fourth exemplary embodiments will not be repeated.

As illustrated in FIG. 10, in solid-state imaging device 5 according to this exemplary embodiment, gate insulating film 511 is formed on a principal surface of semiconductor substrate 501. Gate insulating film 511 is, for example, a silicon oxide ($SiO_2$) film. Photodiode 502 is formed from an interface portion between semiconductor substrate 501 and gate insulating film 511 inwardly in semiconductor substrate 501. Photodiode 502 is structured by a p-n junction between n-type charge accumulation layer 502$a$ and p+ type surface layer 502$b$.

Device isolation region 512 or the like is formed in addition to photodiode 502 in a surface layer of semiconductor substrate 501. Device isolation region 512 is formed by performing ion implantation of impurities such as boron in a corresponding portion of semiconductor substrate 501. Although solid-state imaging device 5 also has floating diffusion (FD) and transistor elements in each pixel portion 500, they are omitted from the illustration.

Anti-reflection film 513 and gate electrode 514 are formed on gate insulating film 511 and above photodiode 502. Anti-reflection film 513 is formed of, for example, silicon nitride (SiN) or silicon oxynitride (SiON) and is provided to prevent light that enters photodiode 502 from being reflected by a surface of semiconductor substrate 501. Gate electrode 514 is formed of, for example, polysilicon or tungsten silicide.

Next, wiring layer 503 is formed on gate insulating film 511 as in the case of the previous exemplary embodiments. In solid-state imaging device 5 according to this exemplary embodiment, wiring layer 503 includes, sequentially from a lower side in the Z-axis direction, insulating film 505$a$, etch stop layer 516, insulating film 505$b$, diffusion preventing film 517$a$, insulating film 505$c$, diffusion preventing film 517$b$, and insulating film 505$d$. Also, insulating films 505$b$ and 505$c$ have wiring layers 504$a$ and 504$b$, respectively.

Insulating film 505$a$ is formed of, for example, silicon oxide ($SiO_2$) and has a film thickness of 400 nm. Etch stop layer 516 is formed of, for example, silicon carbide, silicon oxycarbide, silicon oxynitride, or silicon nitride, and has a film thickness of 50 nm.

Insulating films 505$b$ and 505$c$ are formed of, for example, silicon oxide ($SiO_2$), and have a film thickness of 300 nm and a refraction index of, for example, 1.45.

Diffusion preventing films 517$a$ and 517$b$ are formed of, for example, silicon carbide, silicon oxycarbide, silicon oxynitride, or silicon nitride, and have a film thickness of 50 nm and a refraction index of, for example, 1.9 to 2.0. When wires 504$a$ and 504$b$ are formed, diffusion preventing films 517$a$ and 517$b$ have a function of preventing atoms of copper which is a material of the wire from diffusing into insulating films 505$c$ and 505$d$.

Wires 504$a$ and 504$b$ are formed by burying copper (Cu) or an alloy thereof in grooves formed in advance in insulating films 505$b$ and 505$c$ as in the case of the previous exemplary embodiments. During this process, it is also possible to employ a structure in which a barrier metal layer formed through, for example, damascene process and made of tantalum or tantalum nitride is formed on an outer periphery of the copper wire. The barrier metal layer prevents atoms of copper from diffusing into insulating films 505$b$ and 505$c$.

Also, in solid-state imaging device 5, a recess is opened in insulating film 503 at a position above photodiode 502, and three layers of insulating films 510$a$, 510$b$, and 510$c$ are buried therein to form core portion 510.

The recess in wiring layer 503 has an aspect ratio of 1 or less. It is preferable that a depth of the recess be about 600 nm or smaller. This is because that a void may be formed in the recess if the depth of the recess is larger than 600 nm when insulating films 505$b$, 505$c$, and 505$d$ are formed by using a normal CVD method. If a void is caused in the recess, it causes scattering of light, and the sensitivity is greatly reduced. For this reason, it is preferable that the depth of the recess be about 600 nm or smaller.

The three insulating films (second insulating film 510$a$, third insulating film 510$b$, and fourth insulating film 510$c$) forming core portion 510 are laminated and formed sequentially on a bottom surface and side surfaces of the recess. Fourth insulating film 510$c$ is formed in a manner to fill in the recess that is structured of side surfaces and the bottom surface of third insulating film 510$b$, and upper surface 510$cuf$ thereof has an upward convex shape as in the case of the fourth exemplary embodiment.

Second insulating film 510$a$ is formed of, for example, silicon nitride (SiN) and has a film thickness from a bottom surface (upper surface of etch stop layer 516) facing the recess is about 300 nm. A refraction index of second insulating film 510a formed of silicon nitride (SiN) is 1.9 to 2.0 which is higher than those of insulating films 505b, 505c, and 505d.

Third insulating film 510b is formed of, for example, silicon oxynitride (SiON) and has a film thickness of about 10 nm to 100 nm. A refraction index of third insulating film 510b formed of silicon oxynitride (SiON) is 1.6 to 1.8 which is lower than that of second insulating film 510a.

Fourth insulating film 510c is formed of, for example, silicon nitride (SiN) and has a film thickness from a bottom surface of third insulating film 510b in the Z-axis direction is about 300 nm. A refraction index of fourth insulating film 510c is 1.9 to 2.0 which is higher than that of third insulating film 510b.

The refraction indices of insulating films 505b, 505c, and 505d, and second, third and fourth insulating films 510a, 510b, and 510c are summarized as described below.

If it is assumed that the refraction index of insulating films 505b, 505c, and 505b is n1, the refraction index of second insulating film 510a is n2, the refraction index of third insulating film 510b is n3, and the refraction index of fourth insulating film 510c is n4, the following relations are satisfied.

$n2>n1$ $n3<n2$ $n4>n3$

Next, as illustrated in FIG. 10, color filter 506 is formed on fourth insulating film 510c, and, as in the cases of the second, third, and fourth exemplary embodiments, partition wall 509 is inserted between color filters 506 of adjacent pixel portions 500 in a manner to segment them. A cross sectional shape of partition wall 509 is trapezoid as in the case of the fourth exemplary embodiment.

In solid-state imaging device 5 according to this exemplary embodiment, partition wall 509 has a laminated structure with lower layer 509a and upper layer 509b, and both lower layer 509a and upper layer 509b are TEOS films and have a refraction index of about 1.4 to 1.5. Further, in partition wall 509, an interface having a different material or different film quality from lower layer 509a and upper layer 509b is present therebetween, and the interface reflects light propagating in partition wall 509 downwardly from an upper side in the Z-axis direction and has a function of preventing light from penetrating downwardly.

Partition wall 509 has a height of 600 nm to 800 nm, a width in an upper portion thereof of 150 nm to 250 nm, and a width in a lower portion thereof of 200 nm to 400 nm. More specifically, a height of 700 nm, a width of 200 nm in an upper portion thereof, and a width of 300 nm in a lower portion thereof are set for partition wall 509.

Further, in solid-state imaging device 5 according to this exemplary embodiment, an opening width W1 measured at lower ends of partition wall 509 and an opening width W2 measured at upper ends of the light waveguide are arranged so that an imaginary line extended from an inner inclined surface of partition wall 509 downwardly in the Z-axis direction passes through an inner side of an upper end of the light waveguide. With this arrangement, light that has passed through color filter 506 is guided to the light waveguide without leakage.

Here, if a cell size of pixel portion 500 is assumed as 1.4 μm, width W1 is set to 1000 nm to 1200 nm, and width W2 is set to 900 nm to 1200 nm. More specifically, both of widths W1 and W2 are set to 1100 nm.

In addition, as illustrated in FIG. 10, adhesion layer 515 is formed on an upper surface of the upward convex shape of fourth insulating film 510c between partition walls 509 and on an outer surface of partition wall 509. Adhesion layer 515 is made of, for example, an organic material such as an epoxy resin and has a film thickness of, for example, about 1 nm. Adhesion layer 515 is inserted to increase adhesion between partition wall 509 made of an inorganic material (TEOS film) and color filter 506 made of an organic material. Adhesion layer 515 may be made of, for example, HMDS (hexamethyldisilazane) in addition to the epoxy resin.

Color filter 506 formed between adjacent partition walls 509 has upper surface 506uf formed in a concave shape as in the cases of the first, second, third, and fourth exemplary embodiments. With this arrangement, it is possible to further improve the light collecting rate.

As illustrated in FIG. 10, in solid-state imaging device 5, a part of color filter 506 runs on a top surface of partition wall 509 (sections A1 and A2). However, the part of color filter 506 is distanced from and is not in contact with that of color filter 506 of adjacent pixel portion 500.

Solid-state imaging device 5 having the structure describe above can provide all of the effects that are provided by solid-state imaging devices 1, 2, 3, and 4 according to the first, second, third, and fourth exemplary embodiments, and can reliably guide incident light from color filter 506 into the light waveguide due to the relation between widths W1 and W2.

(Miscellaneous Matters)

In the foregoing, depths of the concave shapes of upper surfaces 106uf, 206uf, 406uf, and 506uf of color filters 106, 206, 406, and 506, respectively, are specified according to relations among film thicknesses of color filters 106, 206, 406, and 506, film thicknesses of planarized films 107, 207, and 507 located thereon, and microlens 108. Central portions of upper surfaces 106uf, 206uf, 406uf, and 506uf of color filters 106, 206, 406, and 506 having concave shapes, respectively, are portions that have smallest thicknesses of color filters 106, 206, 406, and 506. For this reason, the film thickness of such a portion should be a certain thickness or larger for securing a function as a color filter. The film thickness of such a portion is preferably, for example, 400 nm or larger, although it depends on an expected function as a color filter.

Further, an angle of incident light which is refracted by upper surface 106uf, 206uf, 406uf, and 506uf of color filters 106, 206, 406, and 506 is specified based on a relation between the refraction indices of microlens 108 and planarized films 107, 207, and 507. In addition, the refraction indices of color filters 106, 206, 406, and 506 are different for each color. Accordingly, it is possible to further improve the incident angle characteristics by optimizing a design of the concave shapes of upper surfaces 106uf, 206uf, 406uf, and 506uf of color filters 106, 206, 406, and 506 for each color. Although the drawings referred to in the descriptions of the above-mentioned exemplary embodiments do not illustrate details, depths of the concave shapes of upper surfaces 106uf, 206uf, 406uf, and 506uf of color filters 106, 206, 406, and 506, respectively, are different for each color.

The first, second, third, fourth, and fifth exemplary embodiments adopt a structure in which the center of curvature of upper surface 108uf of microlens 108, and the centers of curvature of upper surfaces 106uf, 206uf, 406uf, and 506uf of color filters 106, 206, 406, and 506 are arranged on an identical axis. In contrast, it is also possible to deviate these centers of curvature in a direction crossing the Z-axis direction. For example, the incident angles of light in the center and the peripheral portion of the chip may vary. However, even in such a case, it is possible to make the incident angle characteristics identical with each other in the center and the peripheral portion of the chip by deviating both of the centers of curvature and thereby changing the incident angel characteristics.

Further, FIG. 1 illustrates an aspect in which the plurality of pixel portions 100 in the pixel region 10 are arranged in a matrix form. However, a honeycomb pattern or the like may be used other than the matrix form as an arrangement form of the plurality of pixel portions.

Additionally, in the fifth exemplary embodiment, three layers of insulating films 510a, 510b, and 510c are laminated and formed in the recess opened in wiring layer 503. However, alternatively, four or more insulating films may be laminated and formed. Furthermore, in the fifth exemplary embodiment, second insulating film 510a, third insulating film 510b, and fourth insulating film 510c are sequentially laminated on a bottom surface (upper surface of etch stop layer 516 in FIG. 10) of wiring layer 503 facing the recess. However, the laminating these second, third, and fourth insulating films on the bottom surface is not essential.

It is also possible to provide an inner-layer lens between the microlens and the color filter. In such a case, it is possible to further increase the light collecting rate.

The present invention is useful for realizing a solid-state imaging device as an imaging device incorporated in a digital still camera, a video camera, or the like.

What is claimed is:

1. A solid-state imaging device comprising:
a semiconductor substrate including a plurality of light-receiving portions formed therein and individually having photoelectric conversion functions;
a wiring layer formed on the semiconductor substrate and having a laminated structure of an insulating film and a wire, the wiring layer having recesses in positions individually corresponding to above the plurality of light-receiving portions;
a plurality of color filters formed in a manner corresponding to the plurality of light-receiving portions individually on the wiring layer;
an upper layer formed on the plurality of color filters and including microlenses formed in a manner corresponding to the plurality of light-receiving portions individually,
wherein each of the color filters has a refraction index higher than a refraction index of a portion of the upper layer which makes contact with an upper surface of the color filter, and an upper surface and a lower surface of each of the color filters has a concave shape respectively; and
a second insulating film having a refraction index higher than a refraction index of the color filter formed on the semiconductor substrate, wherein an upper surface of the second insulating film has an upward convex shape corresponding to the concave shape of the lower surface of each of the color filters.

2. The solid-state imaging device according to claim 1, wherein partition walls are individually inserted between the color filters that are adjacent to each other, and
the refraction index of the color filters is higher than a refraction index of the partition walls.

3. The solid-state imaging device according to claim 2, wherein each of the partition walls has side faces that are inclined so that a section width of the partition wall gradually increases from an upper side to a lower side in a direction of lamination.

4. The solid-state imaging device according to claim 2, wherein a portion of the upper surface of the color filter which is most depressed is positioned lower, in the direction of lamination, than a top of the partition wall.

5. The solid-state imaging device according to claim 1, wherein the wiring layer has recesses in positions individually corresponding to above the plurality of light-receiving portions, and
the second insulating film is buried inside each of the recesses.

6. The solid-state imaging device according to claim 1, wherein the color filters are formed with a thickness of at least 400 nm.

7. The solid-state imaging device according to claim 1, wherein an amount of a depression of the concave shape of the upper surface of each of the color filters is 50 nm or larger and 200 nm or smaller.

8. A method for manufacturing a solid-state imaging device, comprising:
forming, inside a semiconductor substrate, a plurality of light-receiving portions individually having photoelectric conversion functions;
forming, on the semiconductor substrate, a wiring layer having a laminated structure of an insulating film and a wire;
forming, on the semiconductor substrate, a second insulating film;
forming, on the second insulating film, a plurality of color filters in a manner corresponding to the plurality of light-receiving portions individually; and
forming, on the plurality of color filters, an upper layer including at least microlenses individually corresponding to the plurality of light-receiving portions,
wherein, in said forming the plurality of color filters, the plurality of color filters are arranged to have a refraction index higher than a refraction index of a portion of the upper layer which makes contact with the upper surface of the color filter and lower than a refraction index of the second insulating film, and to have each of the upper and lower surfaces thereof in a concave shape corresponding to an upward convex shape of the second insulating film.

9. The method for manufacturing a solid-state imaging device according to claim 8, further comprising, subsequent to said forming the wiring layer but prior to said forming the plurality of color filters, forming, on the wiring layer, partition walls in a grid pattern with openings provided in positions individually corresponding to above the plurality of light-receiving portions,
wherein, in said forming the plurality of color filters, each of the color filters is formed in each of the openings opened in each of the partition walls.

10. The method for manufacturing a solid-state imaging device according to claim 8,
wherein, in said forming the wiring layer, recesses are provided in positions individually corresponding to above the plurality of light-receiving portions, and
wherein the method further comprises, subsequent to said forming the wiring layer but prior to said forming the plurality of color filters, burying the second insulating film inside each of the recesses.

* * * * *